United States Patent
Yin et al.

(10) Patent No.: US 10,752,492 B2
(45) Date of Patent: *Aug. 25, 2020

(54) MICROELECTROMECHANICAL DISPLACEMENT STRUCTURE AND METHOD FOR CONTROLLING DISPLACEMENT

(71) Applicant: Agiltron, Inc., Woburn, MA (US)

(72) Inventors: Luzhong Yin, Woburn, MA (US); Jing Zhao, Woburn, MA (US); Guanghai Jin, Woburn, MA (US)

(73) Assignee: Agiltron, Inc., Woburn, MA (US)

( * ) Notice: Subject to any disclaimer, the term of this patent is extended or adjusted under 35 U.S.C. 154(b) by 132 days.

This patent is subject to a terminal disclaimer.

(21) Appl. No.: 15/300,212

(22) PCT Filed: Mar. 24, 2015

(86) PCT No.: PCT/US2015/022117
§ 371 (c)(1),
(2) Date: Sep. 28, 2016

(87) PCT Pub. No.: WO2015/153179
PCT Pub. Date: Oct. 8, 2015

(65) Prior Publication Data
US 2017/0183217 A1    Jun. 29, 2017

Related U.S. Application Data

(63) Continuation of application No. 14/529,602, filed on Oct. 31, 2014, now Pat. No. 9,256,065, and a
(Continued)

(51) Int. Cl.
*B81B 3/00*    (2006.01)
*G02B 26/04*    (2006.01)
(Continued)

(52) U.S. Cl.
CPC .......... *B81B 3/0037* (2013.01); *B81B 3/0024* (2013.01); *G02B 26/02* (2013.01);
(Continued)

(58) Field of Classification Search
CPC ................ B81B 3/0037; B81B 3/0024; B81B 2203/0315; B81B 2201/045;
(Continued)

(56) References Cited

U.S. PATENT DOCUMENTS 4,771,016 A    9/1988  Bajor et al.
4,823,607 A    4/1989  Howe et al.
(Continued)

FOREIGN PATENT DOCUMENTS

CN    105278060 B    11/2017
EP    0469749 A1    2/1992
EP    1143467    10/2001

OTHER PUBLICATIONS

Asheghi et al., Temperature-Dependent Thermal Conductivity of Single-Crystal Silicon Layers in SOI Substrates. Transactions of the ASME. Feb. 1998;120;30-36.
(Continued)

*Primary Examiner* — Cara E Rakowski
(74) *Attorney, Agent, or Firm* — McCarter & English, LLP; Thomas O. Hoover

(57) ABSTRACT

The present disclosure provides a displacement amplification structure and a method for controlling displacement. In one aspect, the displacement amplification structure of the present disclosure includes a first beam and a second beam substantially parallel to the first beam, an end of the first beam coupled to a fixture site, and an end of the second beam coupled to a motion actuator; and a motion shutter coupled to an opposing end of the first and second beams. In response to a displacement of the motion actuator along an
(Continued)

axis direction of the second beam, the motion shutter displaces a distance along a transversal direction substantially perpendicular to the axis direction.

35 Claims, 9 Drawing Sheets

Related U.S. Application Data continuation of application No. 14/242,328, filed on Apr. 1, 2014, now abandoned.

(51) Int. Cl.
  *G02B 26/02* (2006.01)
  *H02N 2/04* (2006.01)
  *H02N 10/00* (2006.01)

(52) U.S. Cl.
  CPC .......... *G02B 26/023* (2013.01); *G02B 26/04* (2013.01); *H02N 2/043* (2013.01); *H02N 10/00* (2013.01); *B81B 2201/045* (2013.01); *B81B 2203/0118* (2013.01); *B81B 2203/0315* (2013.01); *B81B 2203/0384* (2013.01); *B81B 2203/051* (2013.01)

(58) Field of Classification Search
  CPC ..... B81B 2203/0118; B81B 2203/0384; B81B 2203/051; G02B 26/02; G02B 26/04; G02B 26/023; H02N 10/00; H02N 2/043
  See application file for complete search history.

(56) References Cited

U.S. PATENT DOCUMENTS

| | | | |
|---|---|---|---|
| 5,050,838 A | 9/1991 | Beatty et al. | |
| 5,058,856 A | 10/1991 | Gordon et al. | |
| 5,061,642 A | 10/1991 | Fujioka | |
| 5,069,419 A | 12/1991 | Jerman | |
| 5,130,268 A | 7/1992 | Liou et al. | |
| 5,163,463 A * | 11/1992 | Gassman | F15B 5/003 137/82 |
| 5,180,623 A | 1/1993 | Ohnstein | |
| 5,238,223 A | 8/1993 | Mettner et al. | |
| 5,325,880 A | 7/1994 | Johnson et al. | |
| 5,355,712 A | 10/1994 | Petersen et al. | |
| 5,506,919 A | 4/1996 | Roberts | |
| 5,529,279 A | 6/1996 | Beatty et al. | |
| 5,534,111 A | 7/1996 | Hocker et al. | |
| 5,600,174 A | 2/1997 | Reay et al. | |
| 5,681,024 A | 10/1997 | Lisec et al. | |
| 5,682,053 A | 10/1997 | Wiszniewski | |
| 5,741,740 A | 4/1998 | Jang et al. | |
| 5,783,854 A | 7/1998 | Dries et al. | |
| 5,785,295 A | 7/1998 | Tsai | |
| 5,862,003 A | 1/1999 | Saif et al. | |
| 5,883,310 A | 3/1999 | Ho et al. | |
| 5,903,380 A | 5/1999 | Motamedi et al. | |
| 5,909,078 A | 6/1999 | Wood et al. | |
| 5,955,817 A | 9/1999 | Dhuler et al. | |
| 5,962,949 A | 10/1999 | Dhuler et al. | |
| 5,994,816 A | 11/1999 | Dhuler et al. | |
| 6,002,132 A | 12/1999 | Mooney et al. | |
| 6,023,121 A | 2/2000 | Dhuler et al. | |
| 6,070,851 A | 6/2000 | Tsai et al. | |
| 6,114,794 A | 9/2000 | Dhuler et al. | |
| 6,124,663 A | 9/2000 | Haake et al. | |
| 6,126,311 A | 10/2000 | Schuh | |
| 6,137,206 A | 10/2000 | Hill | |
| 6,140,646 A | 10/2000 | Busta et al. | |
| 6,167,185 A | 12/2000 | Smiley et al. | |
| 6,173,105 B1 | 1/2001 | Aksyuk et al. | |
| 6,211,598 B1 | 4/2001 | Dhuler et al. | |
| 6,218,762 B1 | 4/2001 | Hill et al. | |
| 6,236,139 B1 | 5/2001 | Hill et al. | |
| 6,239,685 B1 | 5/2001 | Albrecht et al. | |
| 6,246,826 B1 | 6/2001 | O'Keefe et al. | |
| 6,255,757 B1 | 7/2001 | Dhuler et al. | |
| 6,262,512 B1 | 7/2001 | Mahadevan | |
| 6,268,952 B1 | 7/2001 | Godil et al. | |
| 6,275,320 B1 | 8/2001 | Dhuler et al. | |
| 6,291,922 B1 | 9/2001 | Dhuler | |
| 6,309,077 B1 | 10/2001 | Saif et al. | |
| 6,324,748 B1 | 12/2001 | Dhuler et al. | |
| 6,333,583 B1 | 12/2001 | Mahadevan et al. | |
| 6,351,580 B1 | 2/2002 | Dhuler et al. | |
| 6,360,539 B1 * | 3/2002 | Hill | H01H 1/0036 310/306 |
| 6,367,252 B1 | 4/2002 | Hill et al. | |
| 6,428,173 B1 | 8/2002 | Dhuler et al. | |
| 6,465,929 B1 | 10/2002 | Levitan et al. | |
| 6,523,560 B1 | 2/2003 | Williams et al. | |
| 6,557,436 B1 * | 5/2003 | Hetrick | F16H 21/44 267/165 |
| 6,596,147 B2 | 7/2003 | Hill et al. | |
| 6,675,578 B1 | 1/2004 | Sinclair | |
| 6,707,981 B2 | 3/2004 | He | |
| 6,775,459 B2 | 8/2004 | Hong et al. | |
| 6,816,295 B2 | 11/2004 | Lee et al. | |
| 6,838,738 B1 | 1/2005 | Costello et al. | |
| 6,853,765 B1 | 2/2005 | Cochran | |
| 6,901,204 B2 | 5/2005 | Hong et al. | |
| 6,980,727 B1 | 12/2005 | Lin et al. | |
| 6,982,515 B2 | 1/2006 | Howell et al. | |
| 7,007,471 B2 * | 3/2006 | Sinclair | B81B 3/0024 310/307 |
| 7,113,689 B2 | 9/2006 | Hong et al. | |
| 7,242,825 B2 | 7/2007 | Lin et al. | |
| 7,298,954 B2 | 11/2007 | Liu et al. | |
| 7,346,240 B1 | 3/2008 | He et al. | |
| 7,492,994 B1 | 2/2009 | He et al. | |
| 7,567,011 B1 | 7/2009 | Jean et al. | |
| 7,855,682 B2 | 12/2010 | Gould et al. | |
| 7,982,361 B2 | 7/2011 | Maeda et al. | |
| 8,666,218 B2 | 3/2014 | He et al. | |
| 9,256,065 B1 | 2/2016 | Jin et al. | |
| 2002/0113281 A1 | 8/2002 | Cunningham et al. | |
| 2003/0021512 A1 | 1/2003 | Guerin et al. | |
| 2003/0101721 A1 * | 6/2003 | Janssen | B81B 3/0024 60/528 |
| 2003/0156817 A1 | 8/2003 | He | |
| 2004/0126081 A1 | 7/2004 | Hong et al. | |
| 2004/0136680 A1 | 7/2004 | Medina et al. | |
| 2004/0190818 A1 | 9/2004 | Telkamp et al. | |
| 2004/0229440 A1 | 11/2004 | Kim et al. | |
| 2005/0047721 A1 | 3/2005 | Chen et al. | |
| 2005/0082916 A1 | 4/2005 | Ohashi et al. | |
| 2005/0264131 A1 | 12/2005 | Hong | |
| 2006/0034562 A1 | 2/2006 | German et al. | |
| 2006/0127029 A1 | 6/2006 | Lin et al. | |
| 2007/0230865 A1 | 10/2007 | Dames et al. | |
| 2008/0205845 A1 | 8/2008 | Wang et al. | |
| 2010/0045141 A1 | 2/2010 | Pulskamp et al. | |
| 2010/0308690 A1 | 12/2010 | Currano et al. | |
| 2011/0102875 A1 | 5/2011 | Yang et al. | |
| 2011/0217018 A1 * | 9/2011 | He | B23P 11/00 385/140 |
| 2012/0133427 A1 * | 5/2012 | Kim | H01L 23/34 327/564 |
| 2012/0307335 A1 | 12/2012 | Kuriyagawa | |
| 2013/0021656 A1 | 1/2013 | Albus et al. | |
| 2013/0050290 A1 * | 2/2013 | Andersson | B81B 3/007 345/690 |
| 2013/0341300 A1 | 12/2013 | Kim et al. | |
| 2015/0277103 A1 | 10/2015 | Yin et al. | |
| 2017/0184840 A1 | 6/2017 | Yin et al. | |
| 2018/0239127 A1 | 8/2018 | Nishiki et al. | |

OTHER PUBLICATIONS

Benecke et al., Applications of Silicon-Microactuators Based on Bimorph Structures. IEEE Micro Electro Mechanical Systems,

(56) References Cited

OTHER PUBLICATIONS

Proceedings, An Investigation of Micro Structures, Sensors, Actuators, Machines and Robots. Feb. 20-22, 1989, pp. 116-120.
Comtois et al., Design techniques for surface-micromachining MEMS processes. SPIE Sep. 19, 1995;2639:211-222.
Comtois et al., Surface micromachined polysilicon thermal actuator arrays and applications. Proceedings Solid-State Sensor and Actuator Workshop. pp. 174-177. Jun. 1996.
Comtois, et al., Thermal microactuators for surface-micromachining processes. SPIE. Sep. 15, 1995;2642:10-21.
Fedder et al., Thermal Assembly of Polysilicon Microstructures. Proceedings, IEEE Micro Electro Mechanical Systems. pp. 63-68, Jan. 1991.
Field et al., Micromachined 1×2 Optical Fiber Switch. Transducers '95—Eurosensors IX, The 8th International Conference on Solid-State Sensors and Actuators, and Eurosensors IX. pp. 344-347, Jun. 25-29, 1995.
Guckel et al., Thermo-magnetic Metal Flexure Actuators. Technical Digest IEEE Solid-State Sensor and Actuator Workshop. Jun. 22-25, 1992, pp. 73-75.
Jerman, Electrically-activated, normally-closed diaphragm valves. J Micromech Microeng. Dec. 1994;4:210-216.
Judy et al., Surface Micromachined Linear Thermal Microactuator. International Technical Digest on Electron Devices. Dec. 9-12, 1990, pp. 26.5.1-26.5.4.
Kersjes et al., A fast liquid flow sensor with thermal isolation by oxide-filled trenches. Sensors and Actuators A Physical. Mar.-Apr. 1995;47(1-3):373-379.
Kersjes et al., An integrated sensor for invasive blood-velocity measurement. Sensors and Actuators A. Jun.-Aug. 1993;37-38:674-678.
Klaassen et al., Micromachined thermally isolated circuits. Sensors and Actuators A Physical. Jan. 1997;58(1):43-50.
Klaassen et al., Micromachined Thermally Isolated Circuits. Solid-State and Actuator Workshop. Jun. 2-6, 1996, pp. 127-131.
Klaassen et al., Silicon fusion bonding and deep reactive ion etching: a new technology for microstructures. Sensors and Actuators A: Physical. Mar. 1996;52(1):132-139.
Klaassen et al., Silicon Fusion Bonding and Deep Reactive Ion Etching; a New Technology for Microstructures. The 8th International Conference on Solid-State Sensors and Actuators, and Eurosensors IX. Transducers '95—Eurosensors IX. Jun. 25-29, 1995, pp. 556-559.
Lerch et al., Modelization and characterization of asymmetrical thermal micro-actuators. J Micromech Microeng. Mar. 1996;6(1):134-137.
Lisec et al., Thermally Driven Microvalve with Buckling Behaviour for Pneumatic Applications. IEEE Workshop on Micro Electro Mechanical Systems, MEMS '94, Proceedings, IEEE, pp. 13-17, Jan. 1994.
Maluf et al., Single Crystal Silicon Actuators and Sensors Based on Silicon Fusion Bonding Technology. Lucas Novasensor Semiannual Progress Report for the Reporting Period Jan. 1995 to Jul. 1995, ARPA Contract No. DAAL 01-94-C-3411. Jul. 1995. 26 pages.
Maluf et al., Single Crystal Silicon Actuators and Sensors Based on Silicon Fusion Bonding Technology. Semi-Annual Progress Report 1, Contract No. DAAL 01-94-C-3411 Sponsored by the Advanced Research Projects Agency. 14 pages, Jul. 1994.
Maluf et al., Single Crystal Silicon Actuators and Sensors Based on Silicon Fusion Bonding Technology. Semi-Annual Progress Report 2, Contract No. DAAL 01-94-C-3411 Sponsored by the Advanced Research Projects Agency. 20 pages, Jan. 1995.
Maluf et al., Single Crystal Silicon Actuators and Sensors Based on Silicon Fusion Bonding Technology. Semiannual Progress Report for the Reporting Period Jan. 1996 to Aug. 1996 (Aug. 1996). Contract No. DAAL 01-94-C-3411 Sponsored by the Advanced Research Projects Agency. 25 pages.
Maluf, An Introduction to Microelectromechanical Systems Engineering. Artech House, Inc. 277 pages, (2000).

Nguyen, Micromachined flow sensors—a review. Flow Meas Instrum. Mar. 1997;8(1):7-16.
Noworolski et al., Fabrication of SOI wafers with buried cavities using silicon fusion bonding and electrochemical etchback. Sensors and Actuators A Physical. Jun. 1996;54(1-3):709-713.
Noworolski et al., Fabrication of SOI wafers with buried cavities using silicon fusion bonding and electrochemical etchback. The 8th International Conference on Solid-State Sensors and Actuators, and Eurosensors IX. Transducers 95—Eurosensors IX. Jun. 25-29, 1995, pp. 71-74.
Noworolski et al., Process for in-plane and out-of-plane single-crystal-silicon thermal microactuators. Sensors and Actuators A: Physical. Jul. 1996;55:65-69.
Oh et al., Thin Film Heater on a Thermally Isolated Microstructure. Materials Research Society Symposium Proceedings. pp. 277-282, (1990).
Pan et al., An electro-thermally and laterally driven polysilicon microactuator. J Micromech Microeng. Mar. 1997;7(1):7-13.
Paul et al., Thermal conductivity of CMOS materials for the optimization of microsensors. J Micromech Microeng. Sep. 1993;3:110-112.
Petersen et al., Single Crystal Silicon Actuators and Sensors Based on Silicon Fusion Bonding Technology. Prepared for Advanced Research Projects Agency, Contract No. DAAL 01-94-C-3411, Reporting Period: Apr.-Jul. 1994 (Jul. 1994). 14 pages.
Petersen et al., Single Crystal Silicon Actuators and Sensors Based on Silicon Fusion Bonding Technology. Semi-Annual Progress Report 2 prepared for Advanced Research Projects Agency, Contract No. DAAL 01-94-003411, Reporting Period: Jul. 1994-Jan. 1995 (Jan. 1995). 20 pages.
Petersen, Silicon as a Mechanical Material. Proceedings of the IEEE. May 1982;70(5):420-457.
Phipps, Design and Development of Microswitches for Micro-Electro-Mechanical Relay Matrices. Thesis. Presented to the Faculty of the Graduate School of Engineering of the Air Force Institute of Technology, Air University. In Partial Fulfillment of the Requirements for the Degree of Master of Science in Electrical Engineering. 254 pages, Jun. 1995.
Que et al., Bent-Beam Electro-Thermal Actuators for High Force Applications. Twelfth IEEE International Conference on Micro Electro Mechanical Systems. MEMS '99. IEEE, pp. 31-36, Jan. 1999.
Safranek, The Properties of Electrodeposited Metals and Alloys: A Handbook. Amer Electroplaters Soc. pp. 295-315, (1986).
Shoji et al., Microflow devices and systems. J Micromech Microeng. Dec. 1994;4(4):157-171.
Sun et al., Lateral In-plane Displacement Microactuators with Combined Thermal and Electrostatic Drive. Solid-State Sensors and Actuator Workshop. pp. 152-155, Jun. 2-6, 1996.
Wood et al., MEMS Microrelays. Mechatronics. Aug. 1, 1998;8:535-547.
Yamagata et al., A Micro Mobile Mechanism Using Thermal Expansion and Its Theoretical Analysis. A comparison with Impact Drive Mechanism using piezoelectric elements. Proceedings IEEE Micro Electro Mechanical Systems an Investigation of Micro Structures, Sensors, Actuators, Machines and Robotic Systems. pp. 142-147, Jan. 25-28, 1994.
Asheghi et al., Thermal conduction in doped single-crystal silicon films. Journal of Applied Physics. Apr. 15, 2002;91(8):5079-88.
Blinder, Doped Silicon Semiconductors. Wolfram Demonstrations Project. Retrieved online at: http://demonstrations.wolfram.com/DopedSiliconSemiconductors/. Wolfram Technologies. 8 pages, Mar. 2011.
Isamoto et al., A 5-V Operated MEMS Variable Optical Attenuator by SOI Bulk Micromachining. IEEE J Sel Topics Quant Elect. May/Jun. 2004;10(3):570-8.
Que et al., Bent-beam electrothermal actuators—Part I: Single beam and cascaded devices. Journal of Microelectromechanical Systems. Jun. 2001;10(2):247-54.
Van Exter et al., Optical and electronic properties of doped silicon from 0.1 to 2 THz. Appl Phys Lett. Apr. 1990;56(17):1694-96.

(56) References Cited

OTHER PUBLICATIONS

U.S. Appl. No. 15/282,870, filed Sep. 30, 2016, 2017-0184840, Published.

* cited by examiner

MICROELECTROMECHANICAL DISPLACEMENT STRUCTURE AND METHOD FOR CONTROLLING DISPLACEMENT

RELATED APPLICATIONS

This patent application is a 35 U.S.C. § 371 national stage filing of International Application No. PCT/US2015/022117, filed on Mar. 24, 2015, which claims priority to U.S. patent application Ser. No. 14/242,328, filed Apr. 1, 2014, and U.S. patent application Ser. No. 14/529,602, filed Oct. 31, 2014, the entire contents of the above applications being incorporated herein by reference.

TECHNICAL FIELD

The present disclosure relates to a microelectromechanical systems (MEMS) displacement structure and a method for controlling displacement. More particularly, the present disclosure relates to a MEMS displacement structure that can generate a large displacement by a small actuation motion and a method for controlling displacement.

BACKGROUND

MEMS structures that are capable to generate a large displacement have wide uses in various applications, such as optical shutter for laser, variable optical actuator for fiber, optical switch, etc. However, MEMS devices are intrinsically small in size. Therefore, efficient mechanical motion amplification structure is critical for many commercial applications.

Several MEMS displacement amplification designs have been reported. These designs, however, have deficiencies for practical use. In one case, an electrostatic actuator with amplifier can only generate a displacement of less than 200 microns. In order to reach such displacement, a very high voltage is required to generate the necessary force for this type of structure. In another case, a thermal actuator amplifier can be driven at a low voltage. However, traditional thermal actuators can only generate a displacement of around 10-12 microns.

The market needs a MEMS structure that can generate a displacement of more than 500 microns within a small chip footprint. Accordingly, there is a need to develop a new MEMS structure that can generate a displacement of more than 500 microns within a small chip footprint and that can be produced at very low cost.

SUMMARY

A MEMS structure that can generate a large displacement, more than 500 microns, in one instance, within a small chip footprint are disclosed herein below.

In one aspect, the present disclosure provides a displacement amplification structure. The displacement amplification structure comprises a first beam and a second beam substantially parallel to the first beam, an end of the first beam coupled to a fixture site, and an end of the second beam coupled to a motion actuator; and a motion shutter coupled to an opposing end of the first and second beams; wherein, in response to a displacement of the motion actuator along an axis direction of the second beam, the motion shutter displaces along a transversal direction substantially perpendicular to the axis direction. The displacement of the motion actuator may be caused, for example, but not limited to, by one of thermal expansion, motion driven by piezoelectricity, motion driven by magnetic force, and motion driven by electrostatic force. The motion shutter may have, for example, but not limited to, a shape selected from one of a square, a rectangle, a circle, an oval, and a polygon.

In one embodiment, the displacement of the motion actuator along the axis direction ranges from about 25 to about 50 microns, and the motion shutter displaces a distance along the transversal direction for about 500 to 1,000 microns.

In one embodiment, the first and second beams have a strip shape and comprise an elastic material.

According to another aspect, the present disclosure provides a MEMS device. The MEMS device comprises a frame including a fixture site, the frame defining an actuating region and a response region; first and second electrodes in the actuating region and mechanically coupled to the frame; a motion actuator in the actuating region and electrically coupled to the first and second electrodes; first and second beams in the response region, the second beam being substantially parallel to the first beam, wherein an end of the first beam is coupled to the fixture site, and an end of the second beam is coupled to the motion actuator; and a motion shutter in the response region and mechanically coupled to an opposing end of the first and second beams.

In one embodiment, the motion actuator is configured to cause a displacement of the second beam along an axis direction of the second beam in response to a voltage applied to the motion actuator through the first and second electrodes.

In one embodiment, the motion actuator is configured to have an angled shape having a vertex portion and an interior angle ranging from about 120 degrees to about 180 degrees.

In one embodiment, the motion actuator comprises an electrothermal material used to create a thermomechanical action.

In one embodiment, the motion shutter displaces a distance along a transversal direction substantially perpendicular to the axis direction, in response to the displacement of the motion actuator.

In one embodiment, the second beam is mechanically coupled to the vertex portion of the motion actuator.

According to one aspect, the present disclosure provides a method for controlling a motion shutter. The method comprises providing a MEMS device comprising a frame including a fixture site, the frame defining an actuating region and a response region, first and second electrodes in the actuating region and mechanically coupled to the frame, a motion actuator in the actuating region and electrically coupled to the first and second electrodes, first and second beams in the response region, the second beam being substantially parallel to the first beam, wherein an end of the first beam is coupled to the fixture site, and an end of the second beam is coupled to the motion actuator, a motion shutter in the response region and mechanically coupled to an opposing end of the first and second beams; and applying a voltage to the first and second electrodes to cause a displacement of the motion actuator along the axis direction; wherein, in response to the displacement of the motion actuator, the motion shutter displaces a distance along a transversal direction substantially perpendicular to the axis direction.

BRIEF DESCRIPTION OF THE DRAWINGS

The present disclosure is to be read in conjunction with the accompanying drawings, in which:

FIG. 1b illustrates another view of the embodiment of FIG. 1a;

DETAILED DESCRIPTION

The following detailed description is of the best currently contemplated modes of carrying out the present disclosure. The description is not to be taken in a limiting sense, but is made merely for the purpose of illustrating the general principles of the present disclosure, because the scope of the present disclosure is defined by the appended claims.

As used herein, the singular forms "a," "an," and "the" include the plural reference unless the context clearly dictates otherwise.

Except where otherwise indicated, all numbers expressing quantities of ingredients, reaction conditions, and so forth used in the specification and the claims are to be understood as being modified in all instances by the term "about." Further, any quantity modified by the term "about" or the like should be understood as encompassing a range of ±10% of that quantity.

For the purposes of describing and defining the present disclosure, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Figure 1:
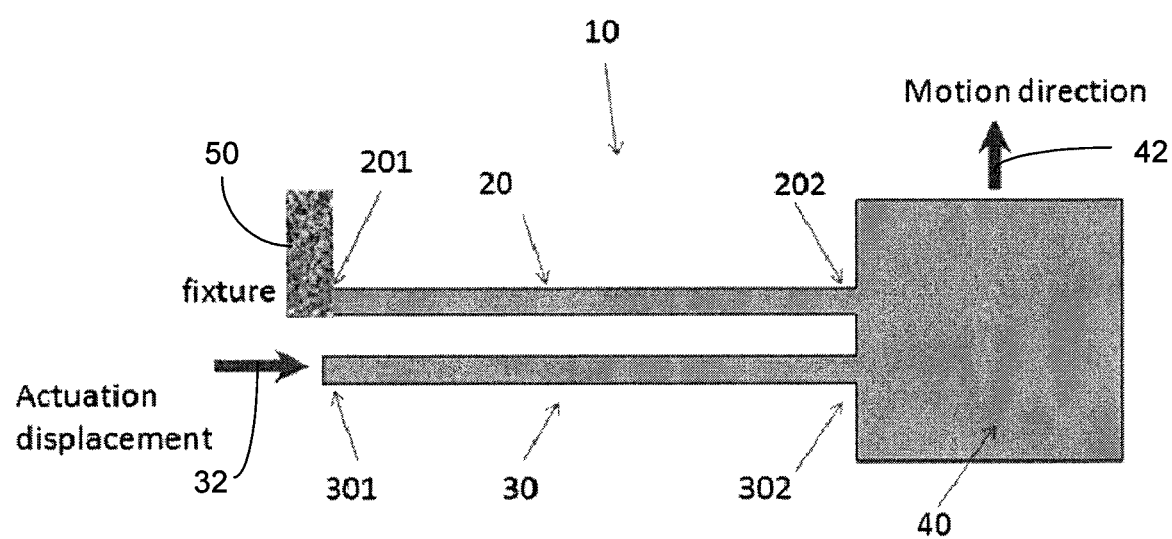
FIG. 1 illustrates a MEMS displacement amplification structure, in accordance with one embodiment of the present disclosure.

FIG. 1 illustrates a MEMS displacement amplification structure, in accordance with one embodiment of the present disclosure. As shown in FIG. 1, an displacement amplification structure 10 includes first and second beams 20 and 30 that are closely posed and substantially parallel to each other. In one embodiment, first and second beams 20 and 30 have a stripe shape, and comprise an elastic or flexible material, such as silicon. In one embodiment, first and second beams 20 and 30 are separated with each other by a gap of about 20 to 75 microns.

As shown in FIG. 1, end 201 of first beam 20 is fixed to an immobilized fixture 50. End 301 of second beam 30 has a degree of freedom along an axis direction 32 of second beam 30. Ends 202 and 302 of beams 20 and 30 are connected to a motion shutter 40. In this particular embodiment, motion shutter 40 has a square shape. It is appreciated that motion shutter 40 may be of other shapes, such as, but not limited to, rectangle, triangle, circle, oval, polygon, etc. In one embodiment, motion shutter 40 is made of an opaque material, such as silicon coated with gold.

A small input displacement (e.g., 25 to 50 microns) along axis direction 32 of second beam 30 at end 301 bends first and second beams 20 and 30, and causes a differential axis motion between first and second beams 20 and 30. The differential motion transfers into a large displacement (e.g., 500 to 1,000 microns) for motion shutter 40 in a transversal direction 42. The input displacement can be generated by thermal expansion, magnetic force, electrostatic force, piezoelectricity, and other suitable actuation sources.

Figure 2A:
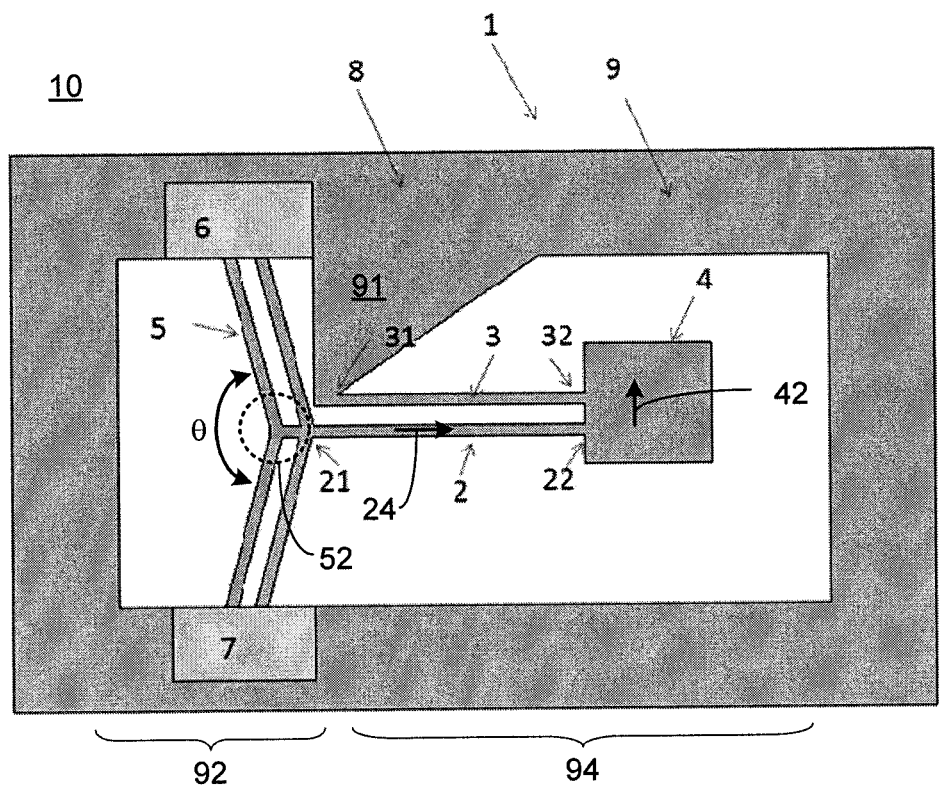
FIGS. 2a and 2b respectively illustrate a plain view and a perspective view of a MEMS displacement amplification structure, in accordance with one embodiment of the present disclosure.
Figure 2B:
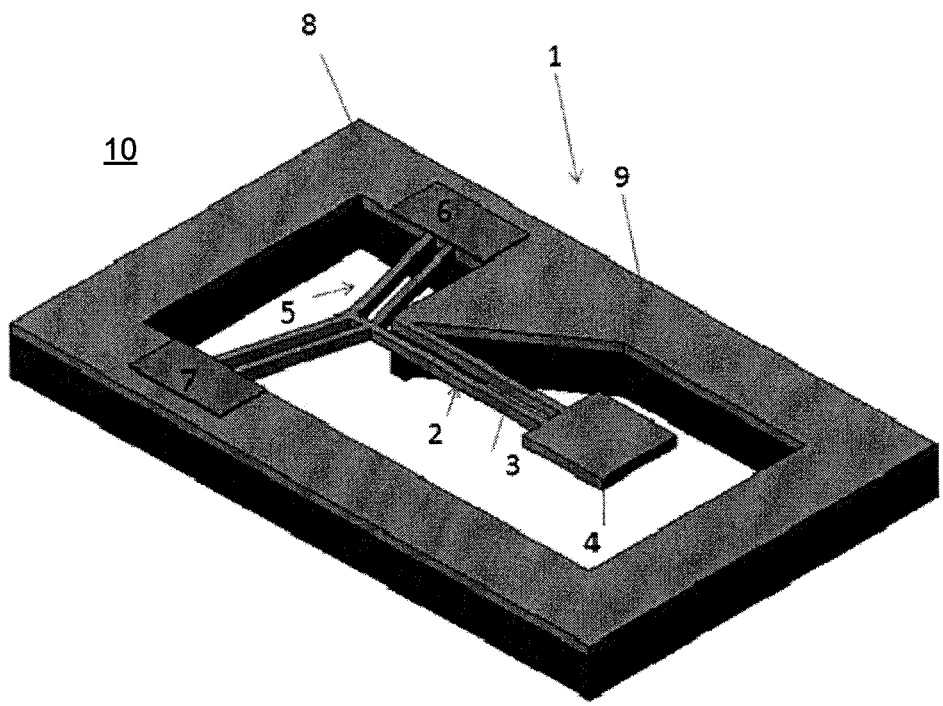

FIGS. 2A and 2B respectively illustrate a plain view and a perspective view of a MEMS displacement amplification structure, in accordance with one embodiment of the present disclosure. As shown in FIGS. 2A and 2B, a MEMS large motion structure 10 includes a frame 9 defining a planar surface 8, first and second beams 2 and 3, a motion shutter 4, a motion actuator 5, and first and second electrodes 6 and 7. In one embodiment, all of these components are configured in the same planar surface 8.

Frame 9 includes a fixture site 91 and further defines an actuating region 92 and a response region 94. First and second electrodes 6 and 7 are disposed in actuating region 92 and are mechanically coupled to frame 9. Motion actuator 5 is disposed in actuating region 92 and is electrically coupled to first and second electrodes 6 and 7.

First and second beams 2 and 3 are disposed in response region 94. Second beam 3 is substantially parallel to first beam 2. End 21 of first beam 2 is connected to a central portion (or output portion) of the actuator 5. End 22 of first beam 2 is connected to motion shutter 4. End 31 of second beam 3 is coupled to and immobilized at fixture site 91. End 32 of second beam 3 is mechanically coupled to motion actuator 4. Motion shutter 4 is disposed in the response region and mechanically coupled to ends 22 and 32 of first and second beams 2 and 3.

In one embodiment, an electric current or voltage (e.g., 3 Volts) is applied to motion actuator 5 through first and second electrodes 6 and 7, so as to cause a displacement (e.g., 500 microns) of second beam 2 along an axis direction 24 of second beam 2. In response to the displacement of motion actuator 5, motion shutter 4 displaces a distance along a transversal direction 42 substantially perpendicular to axis direction 24. In one embodiment, motion actuator 5 comprises an electrothermal material.

In one embodiment, motion actuator 5 has a V-shape or an angled shape, which has a vertex portion 52 and an interior angle θ ranging from about 120 degrees to about 180 degrees. In some embodiments, motion actuator 5 may have other shapes and may include a plurality of V-beams. In one embodiment, end 21 of second beam 2 is mechanically coupled to vertex portion 52 of motion actuator 5.

When an electric current/voltage is applied to motion actuator 5, a deformation along axis direction 24 is applied to first beam 2. Such deformation generates a differential motion along axis directions between first and second beams 2 and 3. Due to the constraint along axis direction, this differential axis motion leads to a very large transversal motion of first and second beams 2 and 3. As a result, motion shutter 5 also has a very large transversal motion. In certain embodiments, the transversal motion of motion shutter 5 can be more than 500-1,000 microns within a compact chip size of less than 4 mm. In one embodiment, MEMS structure 10 can be formed from a silicon-on-insulator (SOI) silicon wafer.

Figure 3:
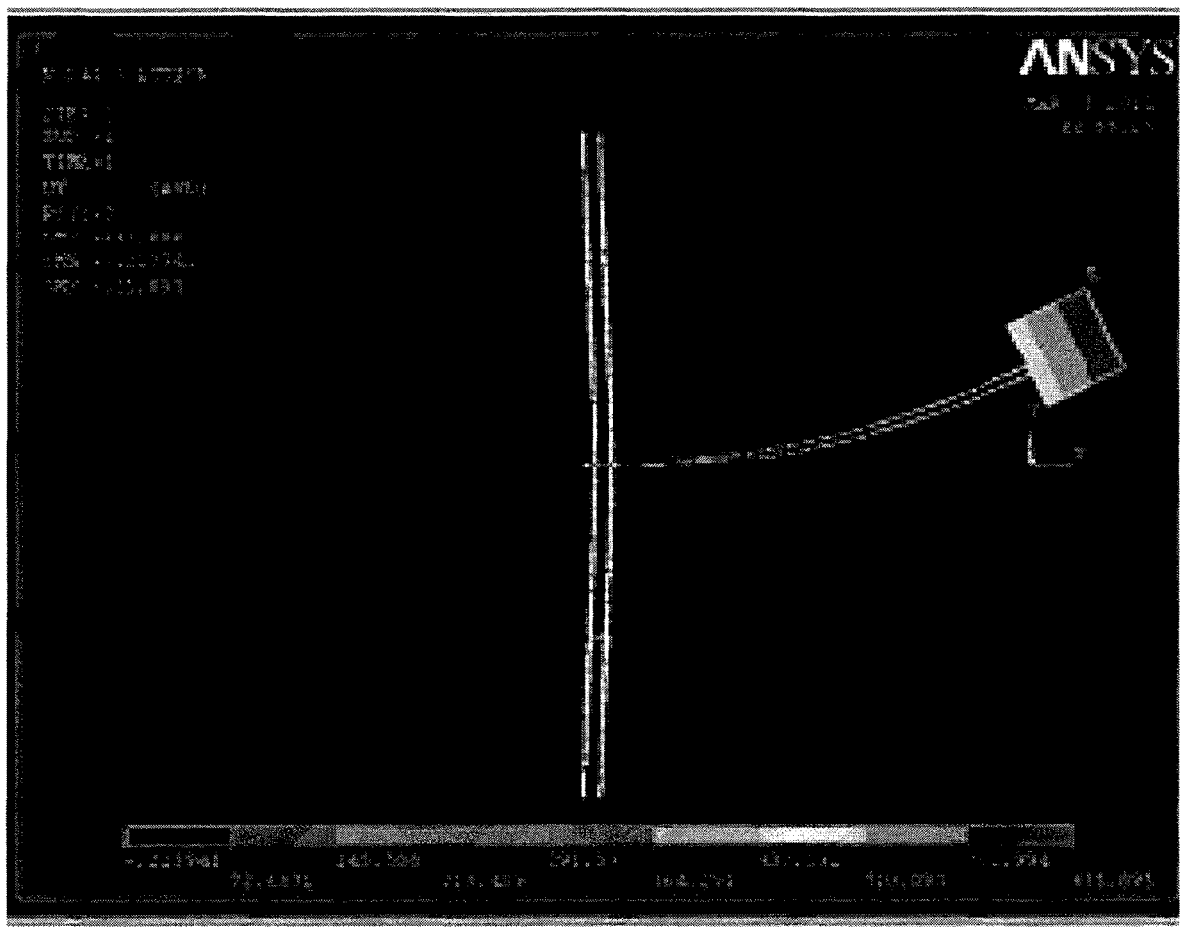
FIG. 3 illustrates a simulation result of a MEMS displacement amplification structure, in accordance with one embodiment of the present disclosure.

FIG. 3 illustrates a simulation result of a MEMS displacement amplification structure, in accordance with one embodiment of the present disclosure.

Figure 1A:
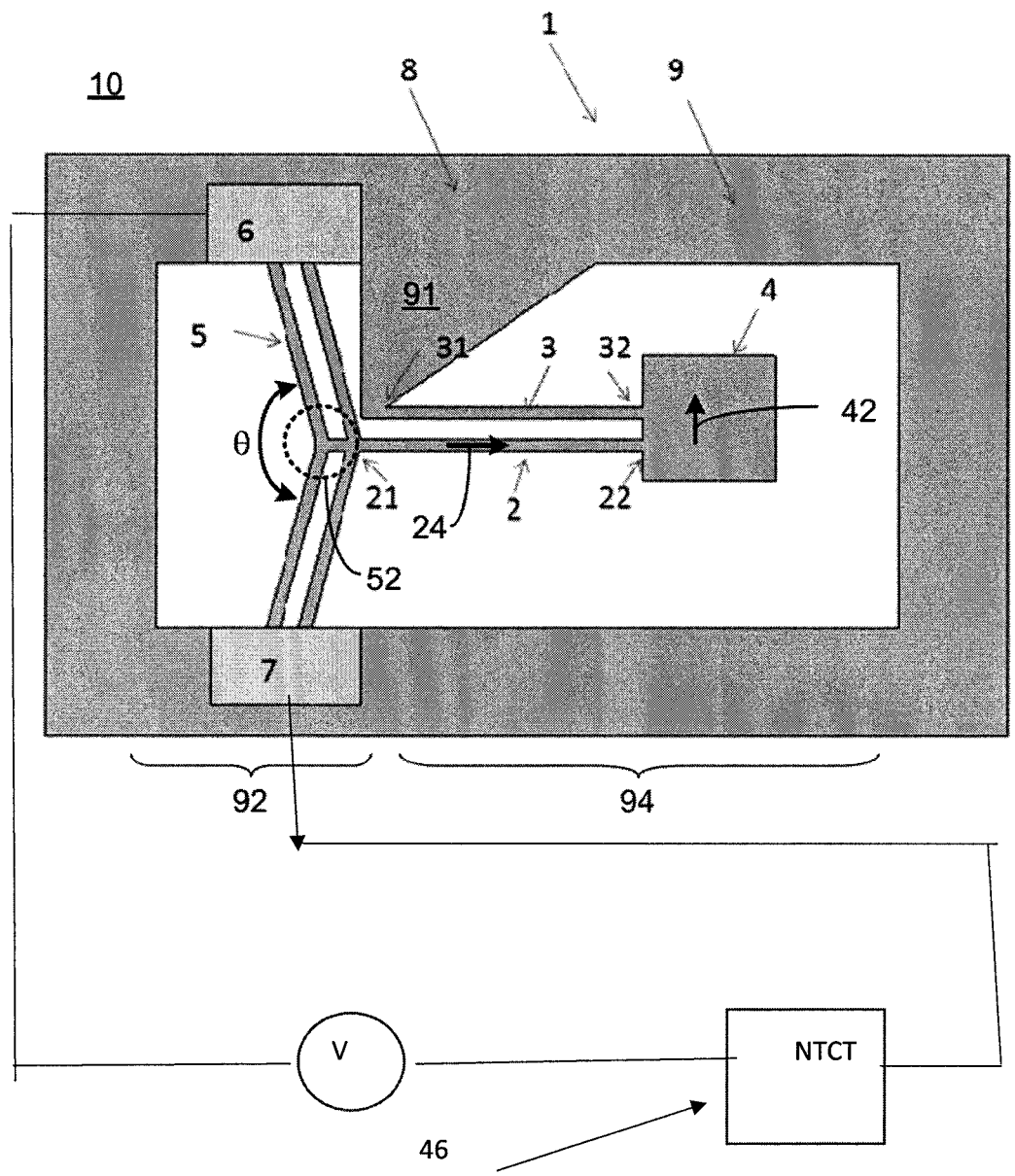
FIG. 1a illustrates an embodiment of the MEMS displacement amplification structure of these teachings.
Figure 1B:
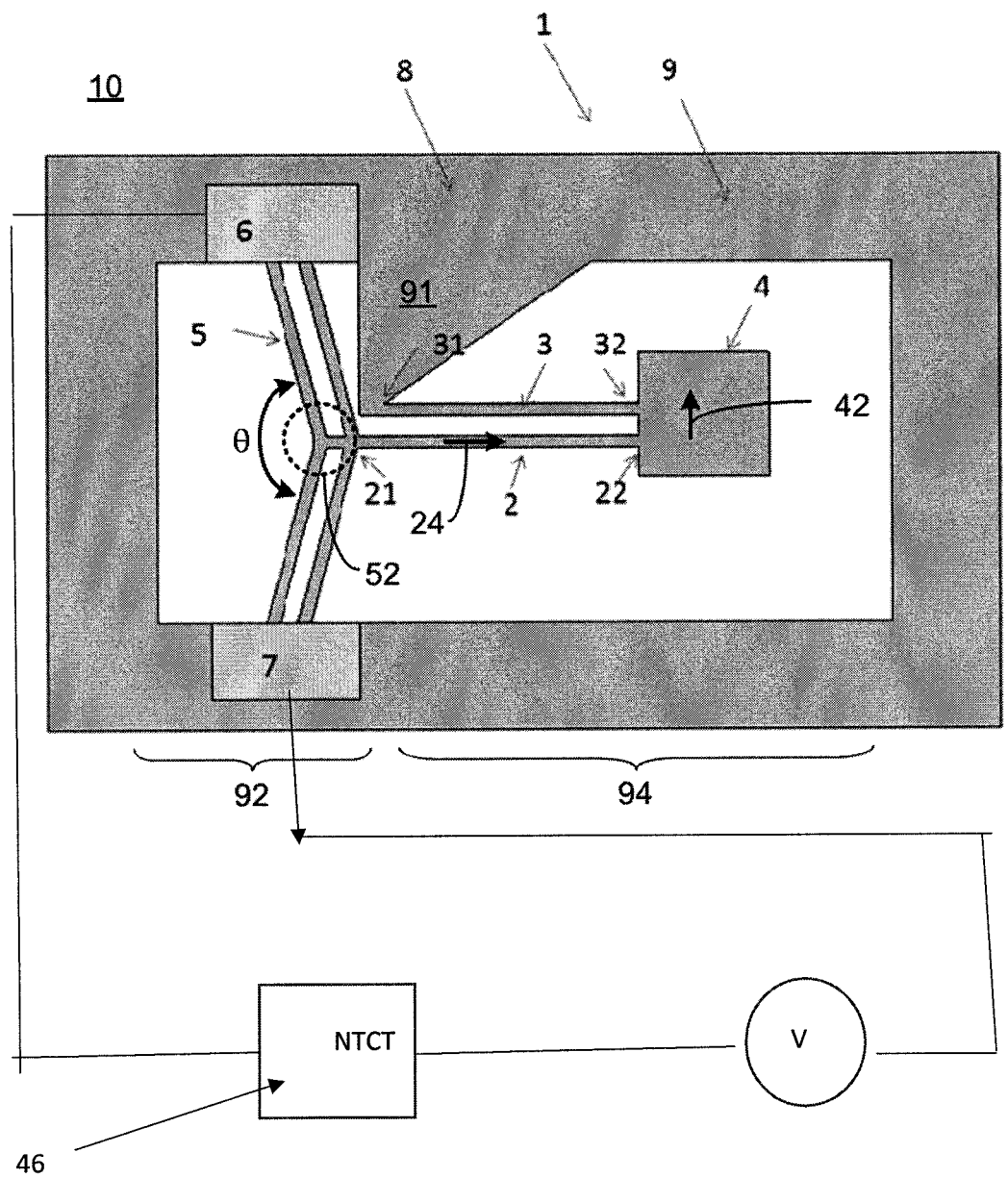

For the compact thermal actuated displacement amplification structure of FIG. 1a, for example, in embodiments using highly doped silicon, during the thermal equilibrium procedure of the device itself or environmental temperature change, the drift could be more than 1 dB. The increased resistance leads to a decreased input power to the actuator when the input voltage holds constant. The increased resistance can be at least partially corrected by a negative temperature coefficient component 41 configured to be electrically connected in series with the voltage source, V, as shown in FIG. 1a. The negative temperature coefficient component 41 can be electrically connected between the first electrode 32a and the voltage source, V, as shown in FIG. 1b, or between the voltage source, V, and the second electrode 32b, as shown in FIG. 1a. Although, for brevity, other embodiments are shown connected to either the first electrode 32a or to the second electrode 32b, both connections are within the scope of these teachings. In the embodiment shown in FIG. 1a, the negative temperature coefficient component 40 is a negative temperature coefficient thermistor, NTCT.

Figure 2C:
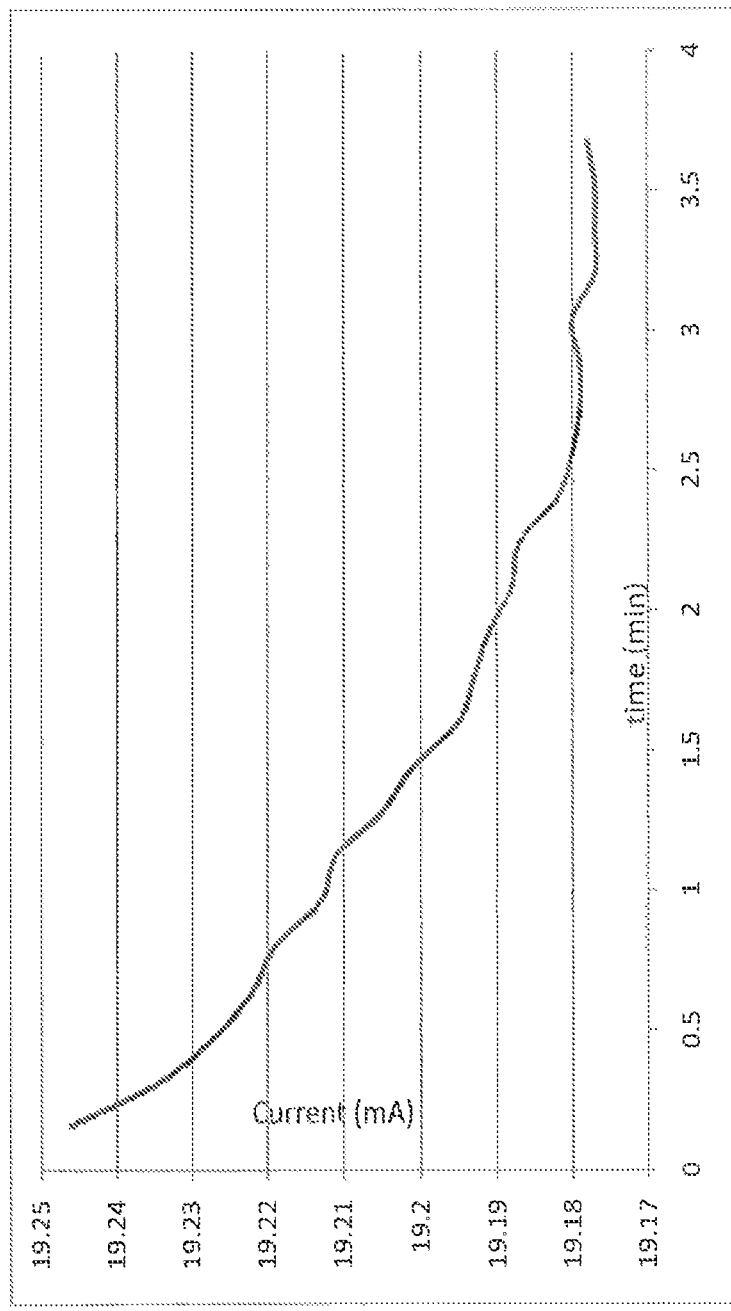
FIG. 2c graphically illustrates the electrical current change after a step voltage input to one embodiment of the MEMS displacement amplification structure of these teachings.

FIG. 2c shows the electrical current change, in an embodiment of the MEMS displacement amplification structure of these teachings, after a step voltage input from the voltage source V, indicating that the resistance of the actuator increases during thermal equilibrium procedure with environment. Thus, with constant voltage applied from the voltage source V, the input power to the actuator decreases. FIG. 3 shows the variation of the resistance of the negative temperature coefficient component 41 as a function of temperature, in which the resistance decreases with temperature. This should be compared to the variation of the resistance of the MEMS displacement amplification structure of these teachings with temperature, in which the resistance of the micro-actuator in the displacement amplification structure of these teachings increases with temperature. Although, in one embodiment, the negative temperature coefficient component 40 can be selected to have, at room temperature, a resistance between about 2% to about 20% of the resistance at room temperature of the MEMS displacement amplification structure of these teachings, the variation of the resistance of the negative temperature coefficient component 41 can be selected so that the variation of the resistance of the negative temperature coefficient component 41 with temperature compensates for a significant portion of the variation of the resistance of the MEMS displacement amplification structure of these teachings with temperature. In one instance, the variation of the resistance of the negative temperature coefficient component 40 with temperature substantially compensates for the variation of the resistance of the MEMS displacement amplification structure of these teachings with temperature.

Figure 4:
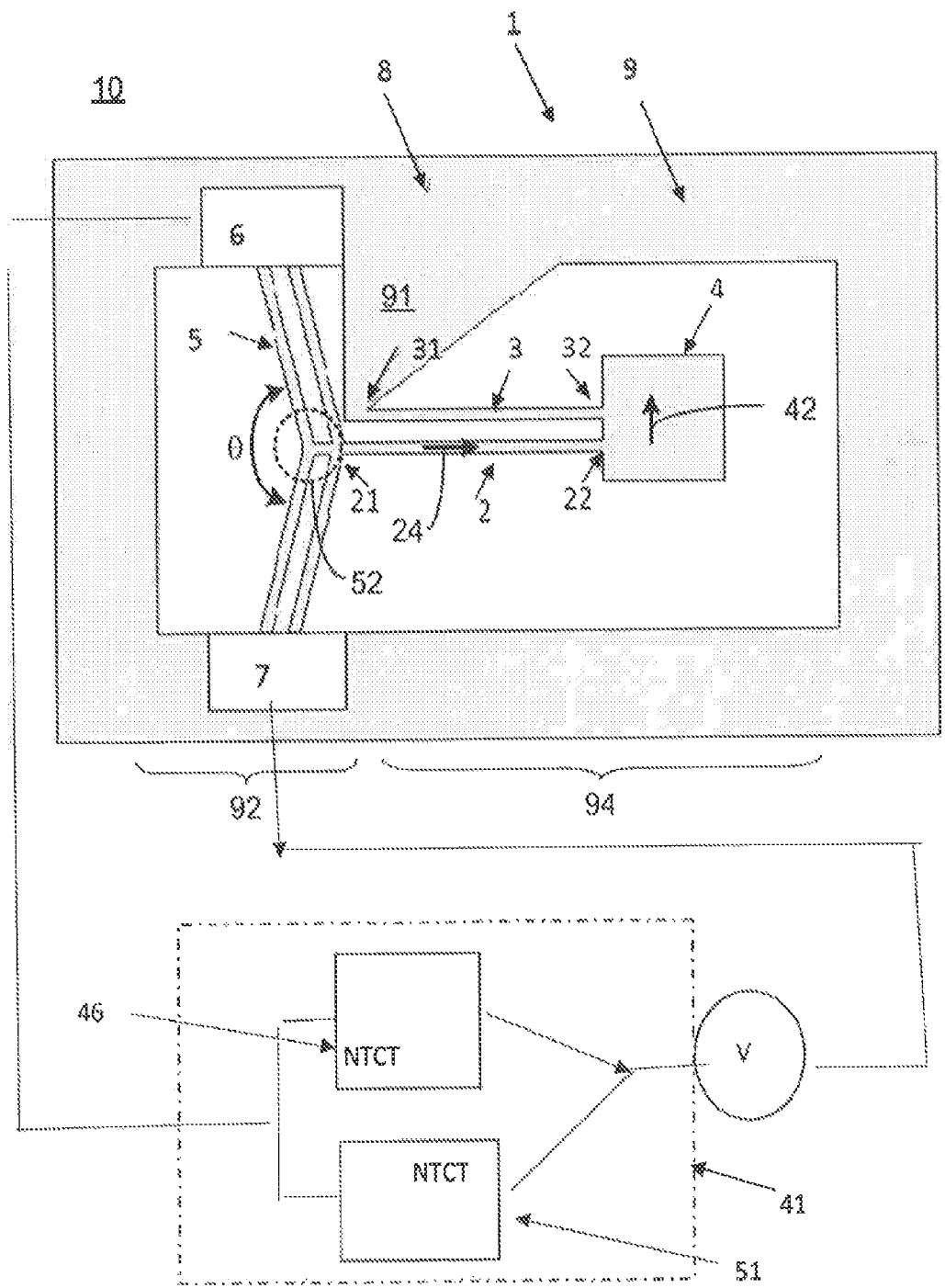
FIGS. 4-6 illustrate details of other embodiments of the MEMS displacement amplification structure of these teachings.

Another embodiment of the negative temperature coefficient component 41 is used in the embodiment of the system shown in FIG. 4. Referring to FIG. 4, in the embodiment shown there in, the negative temperature coefficient component 41 includes a first negative temperature coefficient thermistor 46 electrically connected in parallel with a second negative temperature coefficient thermistor 50.

Figure 5:
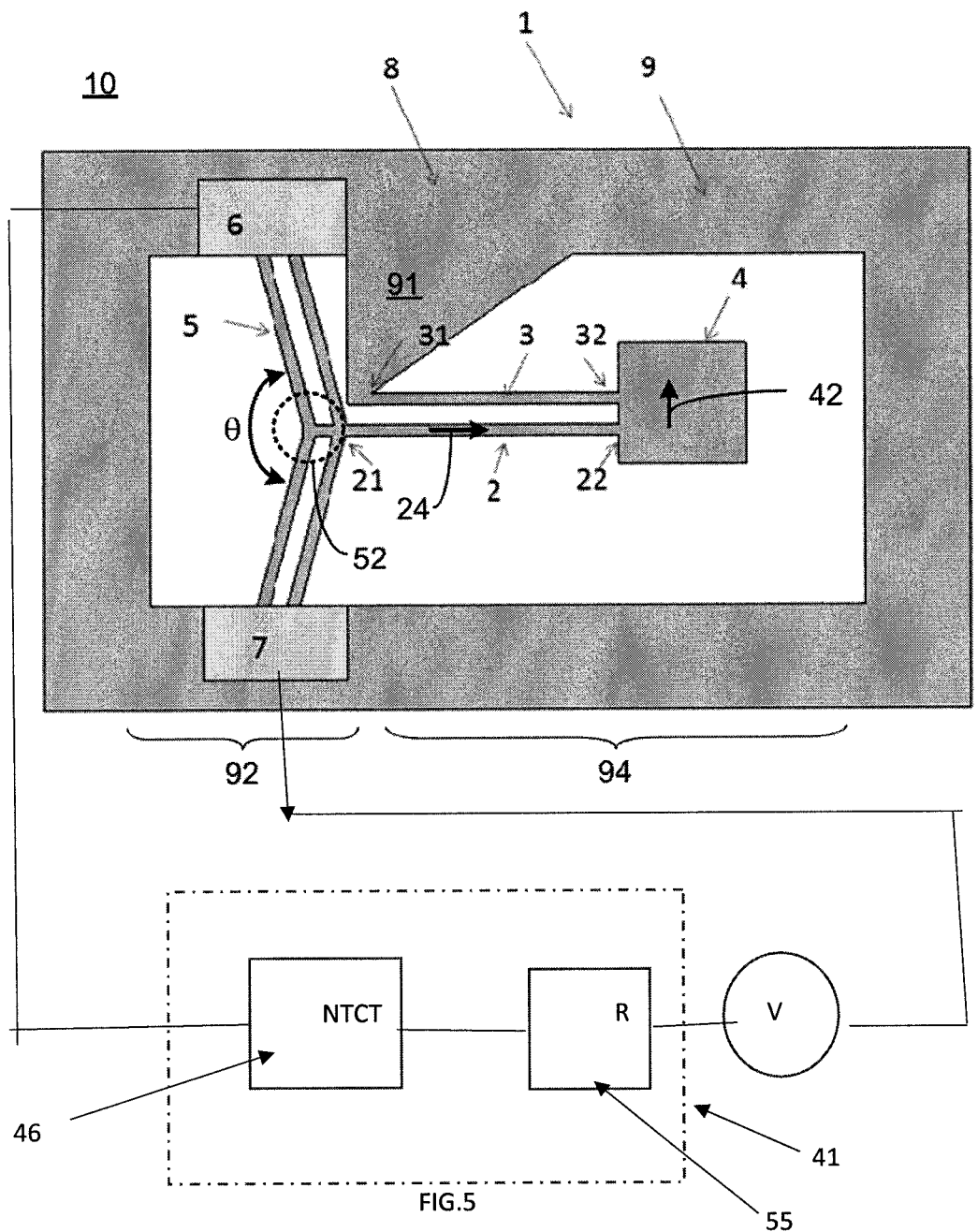

A further embodiment of the negative temperature coefficient component 41 is used in the embodiment of the system shown in FIG. 5. Referring to FIG. 5, in the embodiment shown there in, the negative temperature coefficient component 41 includes a negative temperature coefficient thermistor 45 electrically connected in series to a resistor 55.

Figure 6:
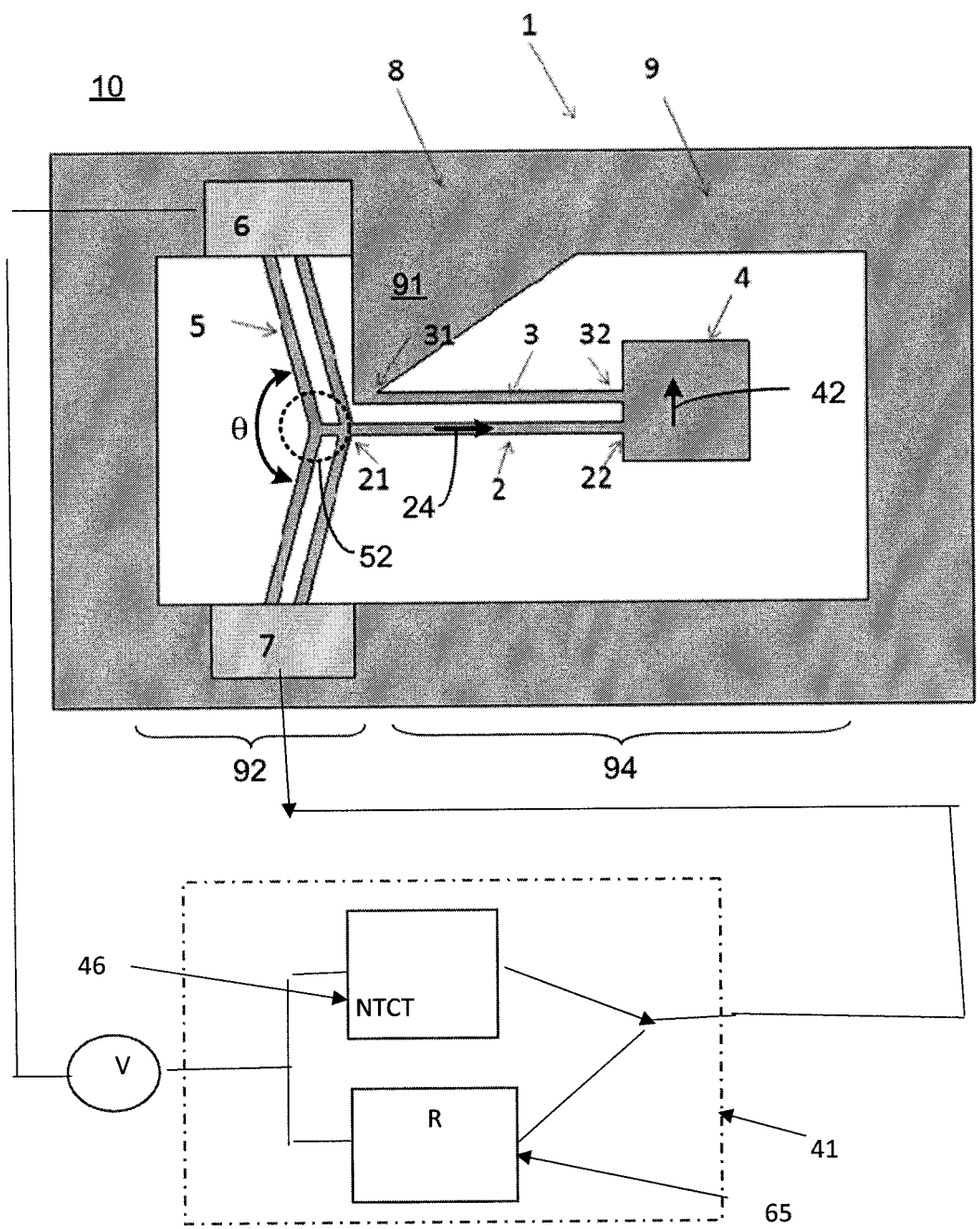

Yet another embodiment of the negative temperature coefficient component 41 is used in the embodiment of the system shown in FIG. 6. Referring to FIG. 6, in the embodiment shown there in, the negative temperature coefficient component 41 includes a negative temperature coefficient thermistor 45 electrically connected in parallel to a resistor 65.

During use of the system of these teachings, a negative temperature coefficient component is electrically connected in series with one of a first electrode or a second electrode of the variable optical attenuator of these teachings. The negative temperature coefficient component is configured to be electrically connected in series with a voltage source, the voltage source configured to be electrically connected in series in order to complete an electrical circuit between the first electrode and the second electrode. In that manner, at least a portion of the variation of the resistance of the variable optical attenuator with temperature is thermally compensated when the voltage source is energized.

In summary, the microelectromechanical motion structure of the present disclosure generates a controlled transversal motion in response to a small deformation in an axis direction of a motion actuator comprising an electrothermal material. Axis motion of one beam causes a differential axis motion of two parallel neighboring beams. Those two beams, on one end, are connected with a motion shutter. The other end of one beam is connected to a V-beam thermal actuator, while the other end of the other beam is fixed at the substrate.

Although the present disclosure has been described with respect to various embodiments, it should be understood that these teachings are also capable of a wide variety of further and other embodiments within the spirit and scope of the appended claims.

What is claimed is:

1. A thermally actuated displacement amplification structure, comprising:
   a motion actuator having a first thermally actuated beam and a second thermally actuated beam that are coupled at an output portion of the motion actuator;
   a motion shutter coupled to a first shutter beam and a second shutter beam that are separated by a gap, a first end of the second shutter beam coupled to the motion actuator at the output portion and a first end of the first shutter beam coupled to a site; and
   wherein, in response to a displacement of the motion actuator along an axis direction of the second shutter beam, the motion shutter displaces along a displacement direction relative to the axis direction, the first shutter beam and the second shutter beam undergoing a relative differential motion to cause an amplified displacement of the motion shutter.

2. The structure of claim 1, wherein the displacement of the motion actuator along the axis direction ranges from about 25 to about 50 microns and the motion shutter displaces a distance along a transverse direction of between 500 microns and 1000 microns.

3. The structure of claim 1, wherein the first shutter beam and the second shutter beam have a strip shape and comprise an elastic material.

4. The structure of claim 1, wherein the motion shutter has a shape selected from one of a square, a rectangle, a circle, an oval, and a polygon.

5. The structure of claim 1, wherein the structure comprises a silicon on insulator (SOI) wafer.

6. The structure of claim 5, wherein the SOI wafer comprises a doped silicon layer on an insulating layer.

7. The structure of claim 1, further comprising a first electrode and a second electrode.

8. The structure of claim 7, further comprising a temperature coefficient component circuit that is electrically connected to the first electrode and the second electrode.

9. The structure of claim 1, wherein the structure comprises an optical attenuator.

10. The structure of claim 9, wherein the motion shutter is an opaque shutter.

11. The structure of claim 1, wherein the motion actuator comprises a v-beam structure.

12. The structure of claim 11 further comprising a plurality of v-beam structures.

13. The structure of claim 1, wherein the motion shutter is displaced at least 500 microns in response to movement of the motion actuator.

14. The structure of claim 1, further comprising a control circuit connected to the motion actuator to control actuation in response to a measured change in a motion actuator operation.

15. The structure of claim 1 wherein the motion actuator is coupled to a frame.

16. The structure of claim 15 wherein the site is on the frame.

17. The structure of claim 15 wherein the site comprises a fixture site on the frame.

18. The structure of claim 15 wherein the frame defines an actuating region and a response region, the motion shutter being displaced in the response region.

19. The structure of claim 1 wherein the first shutter beam comprises a silicon material of an SOI chip having a size less than 4 mm.

20. The structure of claim 1 wherein the second shutter beam is actuated to move on an axis extending to the motion shutter.

21. A thermally actuated displacement amplification structure, comprising:
a motion actuator having a first thermally actuated beam and a second thermally actuated beam that are coupled at an output portion of the motion actuator to form a v-beam structure such that the first thermally actuated beam is positioned at an angle θ relative to the second thermally actuated beam;
a motion shutter coupled to a first shutter beam and a second shutter beam that are separated by a gap, a first end of the second shutter beam coupled to the motion actuator at the output portion and a first end of the first shutter beam coupled to a site; and
wherein, in response to a displacement of the motion actuator along an axis direction of the second shutter beam, the motion shutter displaces along a displacment direction relative to the axis direction, the first shutter beam and the second shutter beam undergoing a relative differential motion to cause an amplified displacement of the motion shutter.

22. The structure of claim 21, wherein the displacement of the motion actuator along the axis direction ranges from about 25 to about 50 microns and the motion shutter displaces a distance along a transverse direction of between 500 microns and 1000 microns.

23. The structure of claim 21, wherein the first shutter beam and the second shutter beam have a strip shape and comprise an elastic material.

24. The structure of claim 21, further comprising a first electrode and a second electrode.

25. The structure of claim 21, wherein the structure comprises an optical attenuator.

26. The structure of claim 21, further comprising a control circuit connected to the motion actuator to control actuation in response to a measured changed in a motion actuator operation.

27. The structure of claim 21, wherein the angle θ is in a range of 120 degrees and 180 degrees.

28. The structure of claim 21, wherein the motion shutter is displaced at least 500 microns in response to movement of the motion actuator.

29. The structure of claim 21 wherein the motion actuator is coupled to a frame.

30. The structure of claim 29 wherein the site is on the frame.

31. The structure of claim 30 wherein the site comprises a fixture site on the frame.

32. The structure of claim 29 wherein the frame comprises an SOI chip having a size of less than 4 mm, the frame having a first electrode and a second electrode to drive the motion actuator.

33. The structure of claim 21 wherein the first shutter beam comprises a silicon material.

34. The structure of claim 21 wherein the second shutter beam is actuated to move on an axis extending to the motion shutter.

35. The structure of claim 21 further comprising a plurality of v-beam structures.

* * * * *